(12) United States Patent
Rudaitis et al.

(10) Patent No.: US 9,146,258 B2
(45) Date of Patent: Sep. 29, 2015

(54) END CAP FOR TEST SWITCH IN WATT HOUR METER HOUSING

(71) Applicants: Erick William Rudaitis, Sterling Heights, MI (US); Justin Arthur Olson, Gibraltar, MI (US)

(72) Inventors: Erick William Rudaitis, Sterling Heights, MI (US); Justin Arthur Olson, Gibraltar, MI (US)

(73) Assignee: E.J. Brooks Company, Farmington Hills, MI (US)

( * ) Notice: Subject to any disclaimer, the term of this patent is extended or adjusted under 35 U.S.C. 154(b) by 99 days.

(21) Appl. No.: 13/912,301

(22) Filed: Jun. 7, 2013

(65) Prior Publication Data

US 2013/0328545 A1    Dec. 12, 2013

Related U.S. Application Data

(60) Provisional application No. 61/657,350, filed on Jun. 8, 2012.

(51) Int. Cl.
*G01R 1/00* (2006.01)
*G01R 11/04* (2006.01)

(52) U.S. Cl.
CPC .................................. *G01R 11/04* (2013.01)

(58) Field of Classification Search
CPC ....................... G01R 31/2887; G01R 31/2893
USPC .................................................. 324/142, 126
See application file for complete search history.

(56) References Cited

U.S. PATENT DOCUMENTS

| 5,385,486 | A | * | 1/1995 | Robinson et al. | ............. 439/517 |
| 7,232,335 | B2 | | 6/2007 | Preuhs et al. | |
| 8,717,007 | B2 | * | 5/2014 | Banhegyesi | .................. 324/110 |

* cited by examiner

*Primary Examiner* — Tung X Nguyen
(74) *Attorney, Agent, or Firm* — Bejin Bieneman PLC

(57) ABSTRACT

An end barrier that may be retroactively attached to a test switch is shown. End barrier includes extending caps to cover screws which are used to fasten the test switch to a utility box.

5 Claims, 5 Drawing Sheets

END CAP FOR TEST SWITCH IN WATT HOUR METER HOUSING

CLAIM TO PRIORITY

This application claims the benefit of co-pending U.S. provisional patent application entitled "End Cap for Test Switch in Watt Hour Meter Housing" filed Jun. 8, 2012 and assigned Ser. No. 61/657,350, which is incorporated by reference herein.

BACKGROUND OF THE INVENTION

Test switches are known for use in combination with watt hour meters. When the watt hour meter is used for a commercial facility the test switches may include a plurality of knife blade switches which allow a known load to be measured which allows the accuracy of the watt hour meter to be determined. If the watt hour meter accuracy is not within the required parameters the watt hour meter is replaced. An example of a prior art test switch is shown in FIG. 5. The test switch of FIG. 5 includes a plurality of knife blade switches (generally referenced as 27) which facilitate connection to the known load in order to measure the accuracy of the meter. As shown nonconductive barriers 31 may be used to segregate knife blade switches.

The design of such test switches must meet the safety standards of a variety of safety standards, such as ANSI or NEPA. Occasionally when a new code is adopted wholesale changes in electrical equipment must be made.

SUMMARY OF THE INVENTION

An end cap having at least one projecting cover is provided. The projecting cover is oriented to shield a screw that fastens the test switch to a molded base which houses a watt hour meter.

BRIEF DESCRIPTION OF THE DRAWINGS

While the claims are not limited to the specific illustrations described herein, an appreciation of various aspects is best gained through a discussion of various examples thereof. Referring now to the drawings, illustrative examples are shown in detail. Although the drawings represent the exemplary illustrations, the drawings are not necessarily to scale and certain features may be exaggerated to better illustrate and explain an innovative aspect of an illustration. Further, the exemplary illustrations described herein are not intended to be exhaustive or otherwise limiting or restricting to the precise form and configuration shown in the drawings and disclosed in the following detailed description. Exemplary illustrations are described in detail by referring to the drawings as follows:

DETAILED DESCRIPTION OF THE PREFERRED EMBODIMENTS

Figure 1:
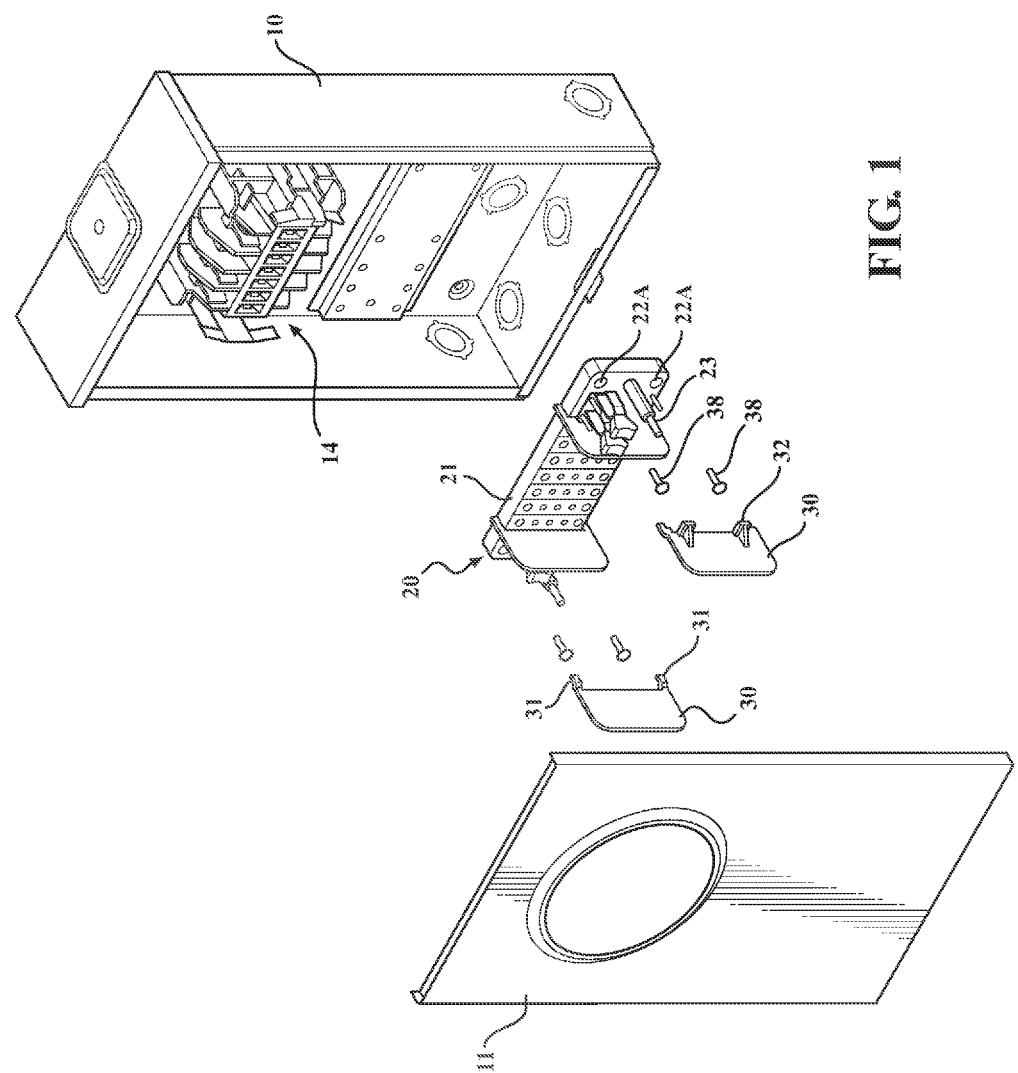
FIG. 1 is an exploded view of a utility box assembly including a test switch.

In order to increase the safety of the test switch according to FIG. 1 it has been proposed to include end caps. Nonconductive safety barriers have been previously known (see e.g. reference numeral 31) they are not oriented at the end of the test switch. In order to provide an end capy at the end of a test switch it has been heretofore necessary to entirely replace the test switch.

The present disclosure provides for an end cap 30 that can be retrofitted onto an existing test switch 22 in order to increase safety where the end cap 30 is configured to reduce any risk of unsafe arcing or other safety risks. Heretofore safe retrofit end caps were not available.

Figure 3:
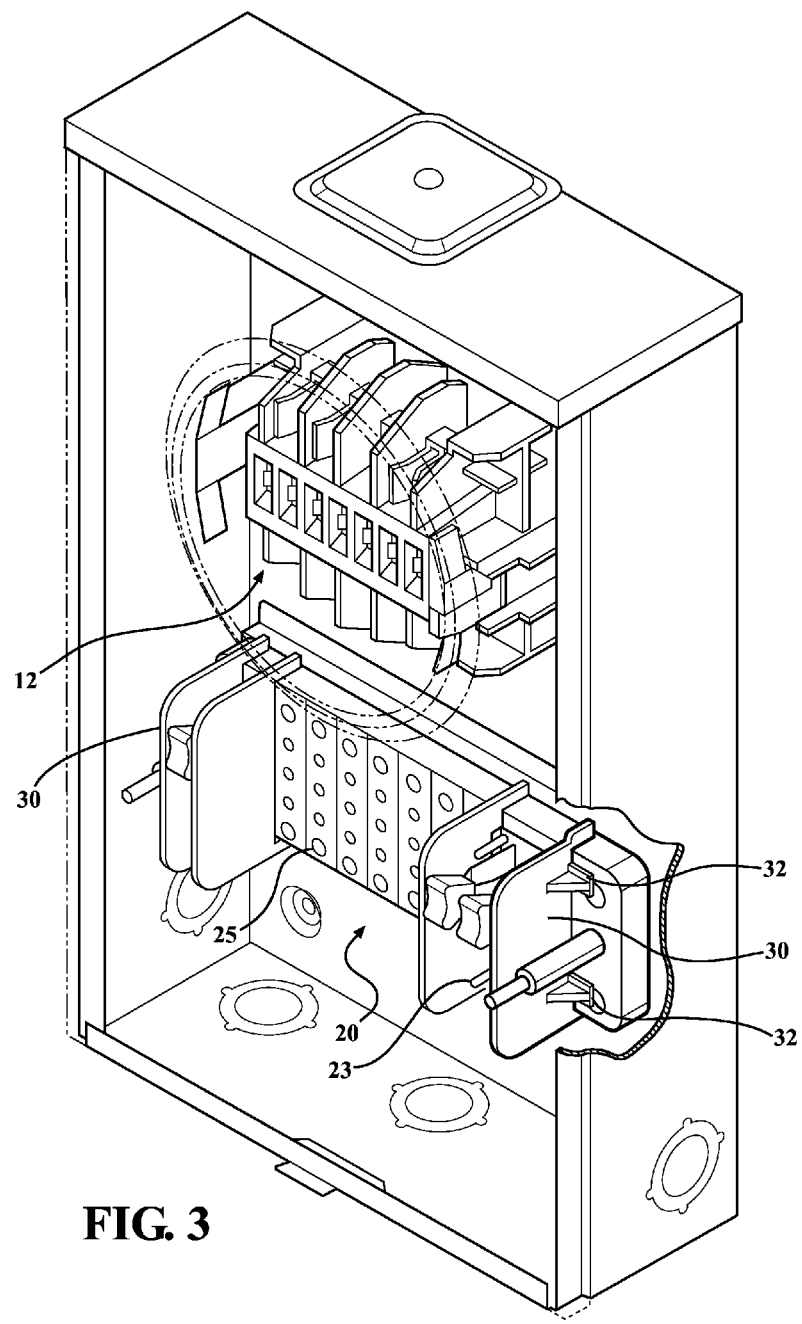
FIG. 3 is a perspective view of a utility box including a test switch.
Figure 4:
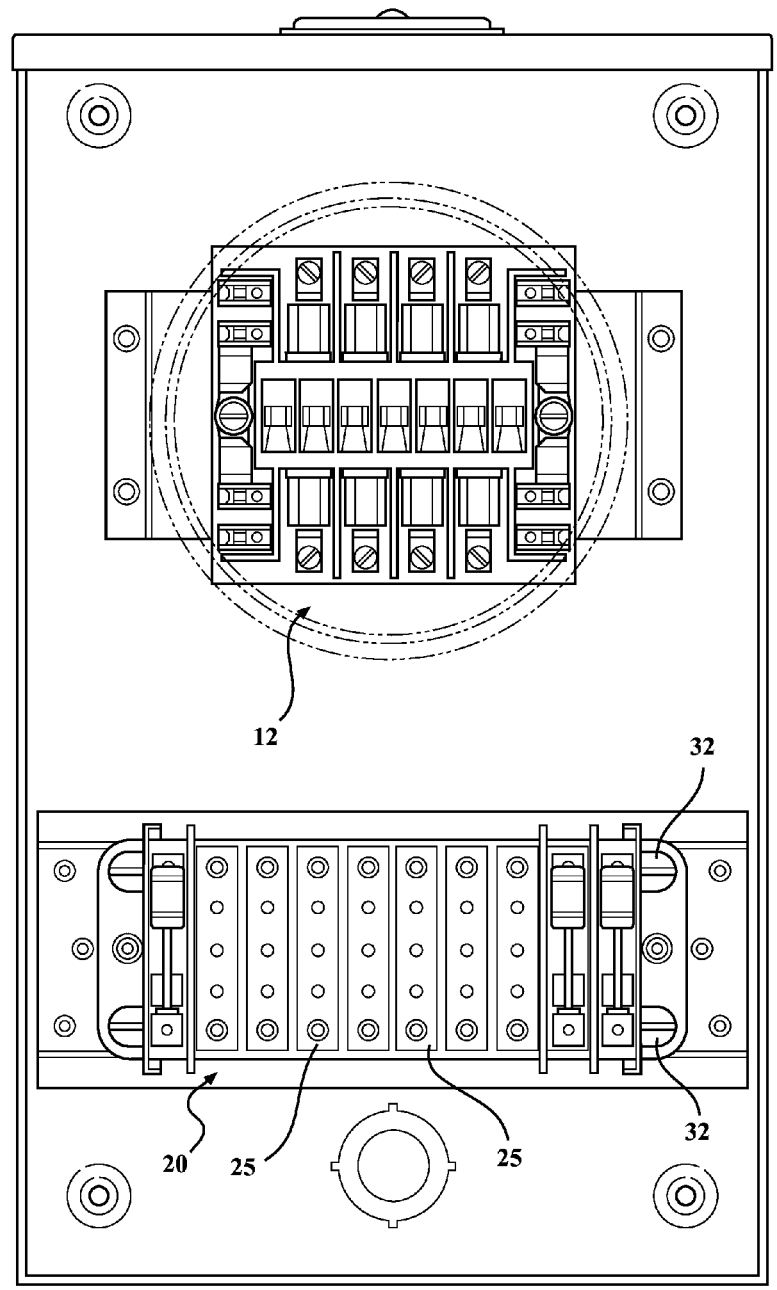
FIG. 4 is a plan view of a utility box including a test switch.
Figure 5:
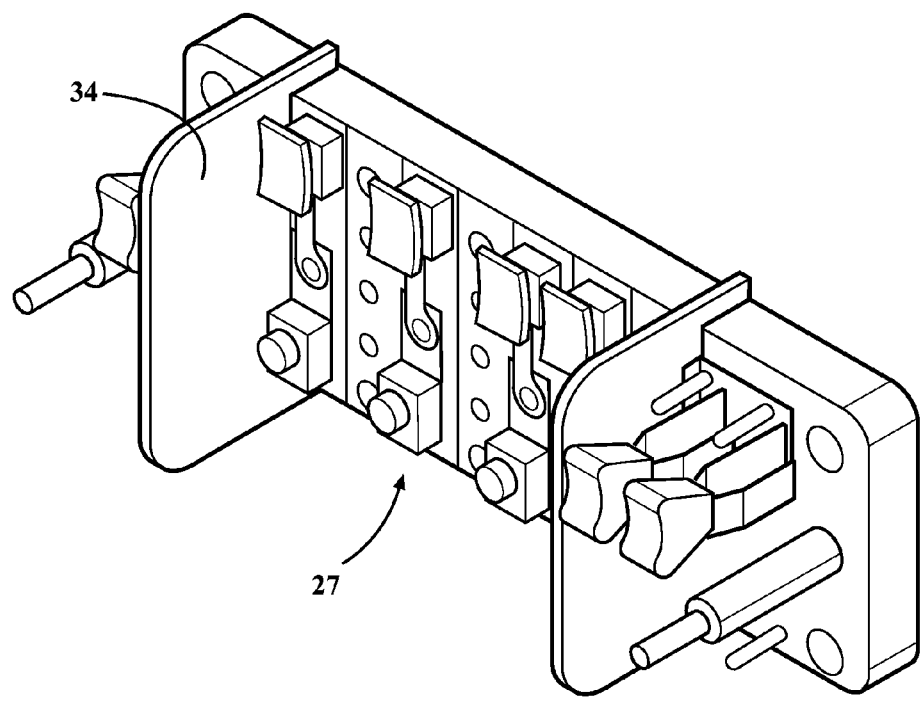
FIG. 5 is a perspective view a prior art test switch.

Referring now to FIGS. 1, 3 and 4 there is provided a utility box including a housing 10 adapted to receive a socket type watt hour meter [not shown] and a test switch 20. Housing 10 would typically be mounted on the side of a commercial building. Housing 10 includes a plurality of jaw contact mounts 14 that are configured to receive socket type watt hour meter. A cover 11 may be attached to housing 10. Cover 11 includes an aperture 12 configured to receive a watt hour meter. Test switch 20 includes a base 21 and is fastened to base by a plurality of screws 38. Typically screws 38 are electrically conductive. Screws 38 are received in recessed pockets 22A. Test switch 20 further includes a pair of opposed supports 23 configured to receive cover 11.

Test switch 22 includes a plurality of receptacles 25 which are configured to receive knife blade switches 27. Typical test switches, such as test switch 22 may include a plurality of knife blade switches that may be received in receptacles 25. Electrically insulating barriers (an exemplar being shown as reference 34) may be positioned between knife blade switches to provide some degree of electrical isolation between test switches in order to reduce the risk of arcing. As noted, the knife blade switches are operable to couple a known load to watt hour meter in order to test its accuracy.

Figure 2:
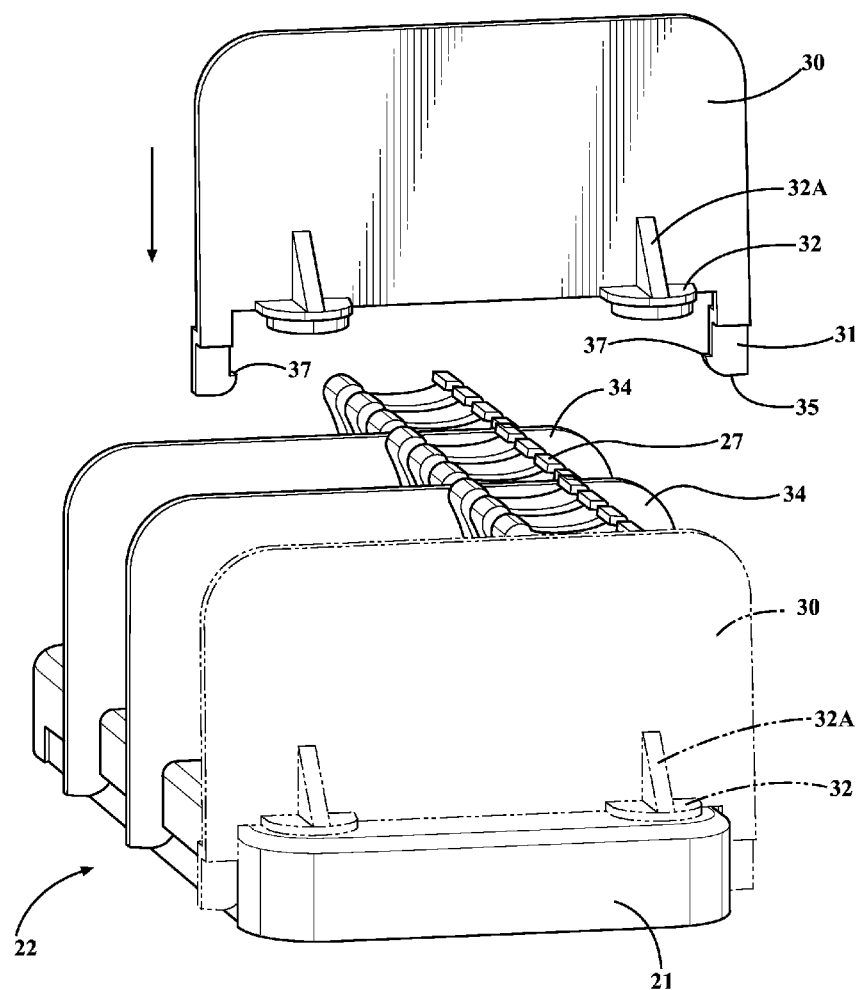
FIG. 2 is a close up perspective view of an exemplar end cap fitting onto an exemplar test switch.

As shown in greater detail in FIG. 2, test switch 22 includes an end barrier 30 positioned at the distal end of the test switch. End barrier 30 is configured to be fastened to the end section of the test switch as shown. End barriers 30 are typically molded from a plastic such as nylon or PVC as a generally planar barrier to prevent inadvertent arcing or sparking when a test load is applied through a knife blade of the test switch 22. End barriers 30 are configured to include a plurality of tabs 31 that snap into corresponding pockets 33 to lock end barriers 30 into place at the distal ends of the test switch. Tabs 31 include a rounded portion 35 to facilitate placement of the tab 31 into a pocket 33 found on the base 21 of the test switch 22. Tab 31 may further include a boss 37 which may further facilitate a more secure capture by a snap fit of the end barrier 30 onto the test switch 22. Bosses 37 make it more difficult to remove end barrier 30 form test switch 22 after placement. Tabs 31 are configured to allow end barriers 30 to be retrofitted onto an existing test switch base 21 without modification of base 21 insofar as base 21 includes pocket 33. It is understood that a wide variety of other fastening mechanisms could be employed.

End barriers 30 further include a plurality of orthogonally projecting caps 32 that are configured to shield screws 38 after the end barrier 30 is fit into place. Caps 32 are more securely held in place and provided reduced spring through gussets 32A. By shielding screws 38 arcing from an electrical source to screws 38 is substantially minimized.

Inclusion of end barriers 30 allows a customer to keep the existing test switch and increase the safety of such test switch without the need of completely replacing the test switch. End barriers 30 are less expensive than replacing an existing test switch insofar as end barriers 30 may be retrofitted to existing test switch devices.

It will be appreciated that the aforementioned process and devices may be modified to have some steps removed, or may have additional steps added, all of which are deemed to be within the spirit of the present invention. Even though the present invention has been described in detail with reference to specific embodiments, it will be appreciated that various modifications and changes can be made to these embodiments without departing from the scope of the present invention as set forth in the claims. Accordingly, the specification and the drawings are to be regarded as an illustrative thought instead of merely a restrictive thought of the scope of the present invention.

What is claimed as new and desired to be protected by Letters Patent of the United States is:

1. A end cap for a test switch, the test switch configured to be included in a housing which also contains a watt hour meter; the test switch including a plurality of pockets about a perimeter of the test switch and a plurality of fasteners configured to attach the test switch to the housing; the end cap comprising:
   a substantially planar barrier;
   at least one tab projecting from the barrier and configured to be received in the pocket, and
   at least one cap projecting from the barrier and configured to cover at least one of the fasteners.

2. The end cap of claim 1 wherein the end cap includes at least two tabs which cover at least two fasteners.

3. The end cap of claim 2 wherein the end cap is made from PVC.

4. The end cap of claim 2 wherein the tab further includes a rounded end.

5. The end cap of claim 4 wherein the tab further includes a boss to facilitate a more secure connection to the test switch.

* * * * *